United States Patent [19]
Matsumoto et al.

[11] Patent Number: 5,814,815
[45] Date of Patent: Sep. 29, 1998

[54] PHASE-CONTRAST ELECTRON MICROSCOPE AND PHASE PLATE THEREFOR

[75] Inventors: Takao Matsumoto, Saitama-Ken; Nobuyuki Osakabe, Kawagoe; Akira Tonomura, Saitama-Ken, all of Japan

[73] Assignee: Hitachi, Ltd., Tokyo, Japan

[21] Appl. No.: 768,355

[22] Filed: Dec. 17, 1996

[30] Foreign Application Priority Data

Dec. 27, 1995 [JP] Japan ................................. 7-340270

[51] Int. Cl.⁶ .................................................. H01J 37/26
[52] U.S. Cl. ............................................................. 250/311
[58] Field of Search ........................................... 250/311

[56] References Cited

U.S. PATENT DOCUMENTS

| 3,500,043 | 3/1970 | Hanssen | 250/311 |
| 3,596,090 | 7/1971 | Hoppe | 250/311 |
| 4,935,625 | 6/1990 | Hasegawa et al. | 250/311 |

OTHER PUBLICATIONS

MRC Laboratory of Molecular Biology, Cambridge, UK, P.N.T. Unwin: *A New Electron Microscope Imaging Method for Enhancing Detail in Thin Biological Specimens*; Z. Naturforsch. 29 a, 158–163 (1974).

Physical Review Letters, vol. 74, No. 3, 16 Jan. 1995, A. Orchowski et al.: *Electron Holography Surmounts Resolution Limit of Electron Microscopy*, pp. 399–402.

Applied Optics, vol. 13, No. 11, Nov. 1974; J.H. Bruning et al.: *Digital Wavefront Measuring Interferometer for Testing Optical Surfaces and Lenses.*

Applied Optics, vol. 19, No. 1, 1 Jan. 1980; N.A. Massie: *Real–time digital heterodyne interferometry: a system.*

Optical Engineering, vol. 18, No. 1, Jan.–Feb. 1979; Glen W. Johnson et al.: *Phase–Locked Interferometry.*

Abstract of JP 60–7048, 14 Jan. 1985, Hitachi Seisakusho K.K., application no. 58–112718 filed 24 Jun. 1983.

*Primary Examiner*—Jack I. Berman
*Attorney, Agent, or Firm*—Kenyon & Kenyon

[57] ABSTRACT

An electrostatic potential in a vacuum in the vicinity of a focused electron beam of a direct wave formed on an optical axis of a back focal plane of an objective lens used in an electron microscope can be externally controlled. Therefore, the electrostatic potential is controlled by supplying an electric potential to a ring-shaped electrode from the outside. The outer sides of the electrode are interposed between both of insulators and conductors so as to shield the electrostatic potential against the outer side of a ring, whereby a phase shift is supplied only to an electron beam that passes through the inside of the ring. A phase-contrast electron microscope can be realized which includes a phase plate corresponding to an electron beam, which is capable of observing a phase object with contrast.

11 Claims, 10 Drawing Sheets

PHASE-CONTRAST ELECTRON MICROSCOPE AND PHASE PLATE THEREFOR

BACKGROUND OF THE INVENTION

This invention relates to an electron microscope and a phase plate therefor, and to a phase-contrast electron microscope suitable for use in observation of a specimen low in amplitude contrast, such as a biological specimen or the like in particular, and a phase plate therefor.

In the field of an optical microscope, the development of a phase-contrast microscope by Zernike has been of extreme importance to the observation of, e.g., a biological specimen or the like low in amplitude contrast. The use of phase contrast makes it possible to observe, with high contrast, a biological specimen, which has been impossible to observe unless it has been previously subjected to staining. Thus, the phase-contrast microscope has contributed immensely to the development of biology and medical science.

Even in the field of an electron microscope, a trial of a phase-contrast microscope using an electron beam has been made to observe a specimen (phase object) low in amplitude contrast. However, no satisfactory results have as yet been arrived at. This is because a phase plate effective against the electron beam has not been constructed.

Figure 11A:
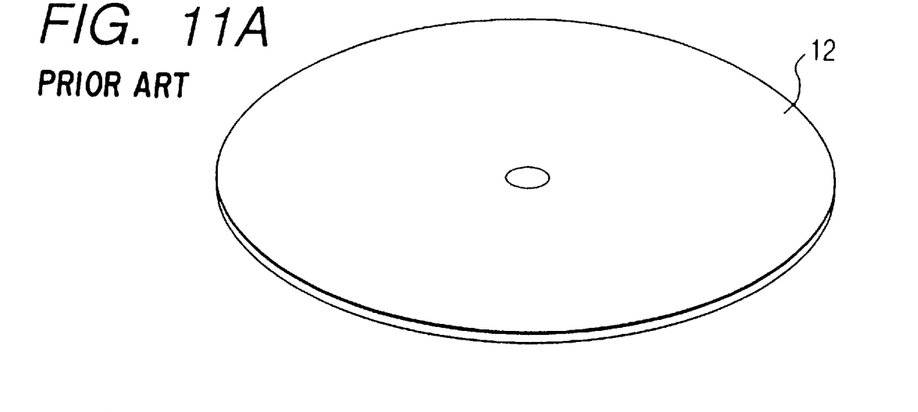

In order to realize a phase-contrast electron microscope, for example, there had heretofore been attempts to place a phase plate 12 using a thin film of low electric conductivity, which phase plate is substantially uniform in thickness and whose central portion is cut, on a back focal plane of an objective lens and give a phase shift to only a scattered wave caused by a specimen to thereby improve contrast as shown in FIG. 11(a). However, the phase plate having this construction has a drawback in that the thin film 12 is contaminated and charged up by the irradiation of an electron or electron beam to thereby produce an uncontrollable phase shift. Another drawback of the phase plate is that the scattered wave passes through the thin film 12 so that a variation in the thickness of the thin film 12 and the like occurs and the electron beam is placed under the influence of noise irrelevant to scattering caused by the specimen. Therefore, the present phase plate has not yet been put to practical use.

Figure 11B:
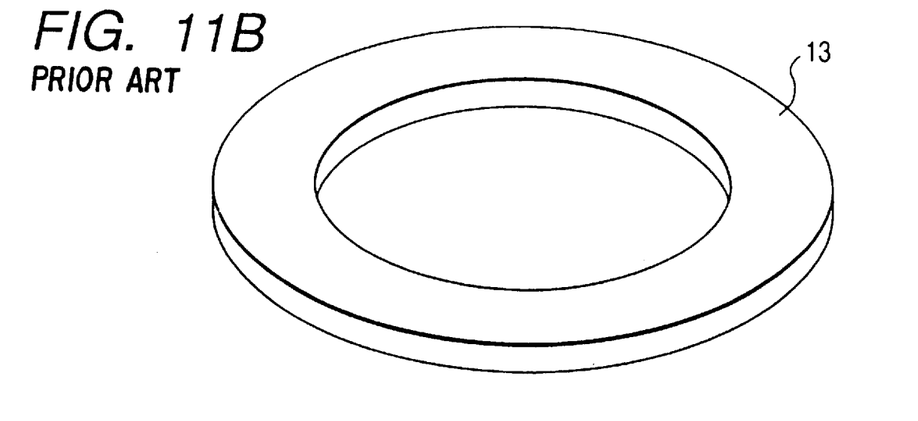

Further, as shown in FIG. 11(b), a phase plate has been also proposed wherein magnetic flux is enclosed within a ring 13 of a magnetic material for rotating the magnetic flux at its inside so as to prevent it from leaking to the outside, whereby phase contrast is applied to an electron transmitted through the inside and outside of the ring 13 by a vector potential using an AB-effect (see Japanese Patent Application Laid-Open No. 60-7048). This type of phase plate is different from the phase plate of the type using the aforementioned thin film and is excellent in that since the electron does not pass through the ring 13, the phase plate is not placed under the influence of those other than a phase shift. However, the present phase plate has not yet been put to practical use partly because it is difficult to adjust the amount of magnetic flux to be enclosed within the ring 13 to the magnitude or level necessary for the phase shift to be set to $\pi/2$, and partly because a method of manufacturing the phase plate is not yet established which is capable of reliably ensuring that the magnetic flux prevents from leaking to the outside of the ring 13. Also restrictions are imposed on the shape of the ring in principle due to the enclosure of the magnetic flux.

Figure 11C:
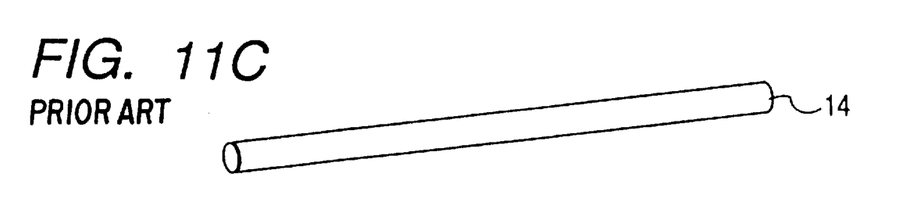

On the other hand, it has been reported that as shown in FIG. 11(c), Unwin and others have attempted to produce an electrostatic phase plate using an electrostatic potential so as to make an improvement in contrast of a biological specimen (e.g., "A New Electron Microscope Imaging Method for Enhancing Detail in Thin Biological Specimens" Z. Naturforsch. 29a (1974), 158–163). In this method, a thin wire 14 made of a material having low electric conductivity is charged up so as to provide a phase shift. However, the control of the amount of its charge will be extremely difficult as will be naturally expected. Therefore, the present phase plate has not yet been put to practical use.

It is not too much to say that all the attempts, which have been made until now to realize the phase plate, has resulted in failure.

SUMMARY OF THE INVENTION

Thus, the conventional embodiments could not resolve the following problems simultaneously:

(1) Influence other than the phase shift due to specimen and (2) Difficulty in controlling the phase shift.

An object of the present invention is to provide a phase plate capable of simultaneously solving the two problems referred to above and observing a phase object with contrast.

Another object of the present invention is to provide a phase-contrast electron microscope having the phase plate referred to above.

A further object of the present invention is to provide a phase-contrast electron microscope which makes an aberration correction possible by using the phase plate.

The problem described in the paragraph (1) referred to above can be solved by utilizing the types such as the phase plates shown in FIGS. 11(b) and 11(c) using the electrostatic potential or the vector potential rather than the type such as the thin-film type of FIG. 11(a), in which the electron or electron beam is transmitted through the phase plate over its entirety. However, since the control on the electrostatic potential is easy rather than the control on the magnetic field as described above, the type using the electrostatic potential is adopted. Further, the problem of the paragraph (2) that it is difficult to externally control the conventional type using the electrostatic potential, can be solved by constructing such a structure that the electrostatic potential of the phase plate can be easily controlled using the micromachining technology.

BRIEF DESCRIPTION OF THE DRAWINGS

FIGS. 11($a$), 11($b$) and 11($c$) are respectively views showing examples of conventional-type phase plates.

DETAILED DESCRIPTION OF THE PREFERRED EMBODIMENTS

A device or phase plate, in analogy with the quarter wavelength phase plate of light, for changing the phase of an electron beam is needed to realize a phase-contrast electron microscope. To this end, the present invention proposes a phase plate having a structure capable of externally controlling an electrostatic potential in a vacuum in the vicinity of a focused electron beam corresponding to a direct wave formed on the optical axis of a back focal plane of an objective lens and also proposes a phase-contrast electron microscope using the phase plate.

Figure 1A:
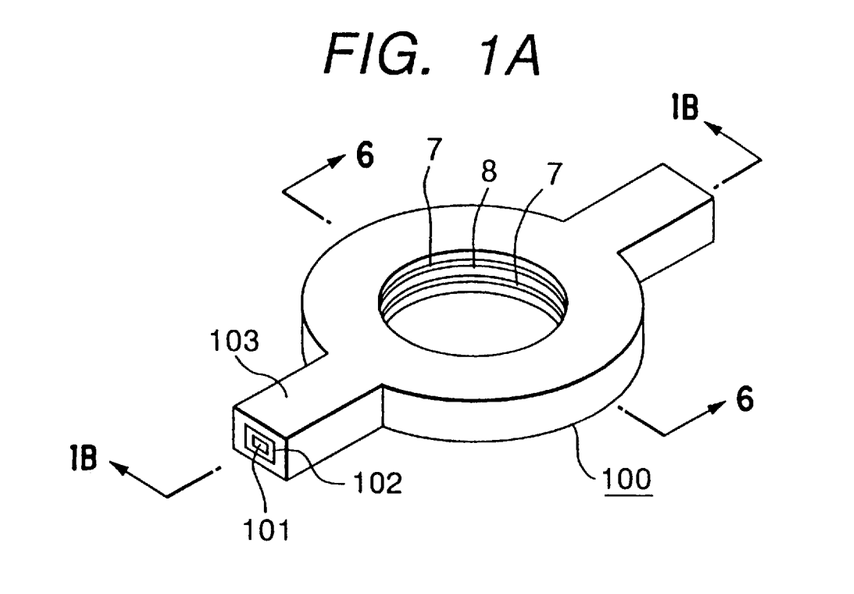
FIG. 1(a) is a perspective view showing a phase plate according to one embodiment of the present invention.
Figure 1B:
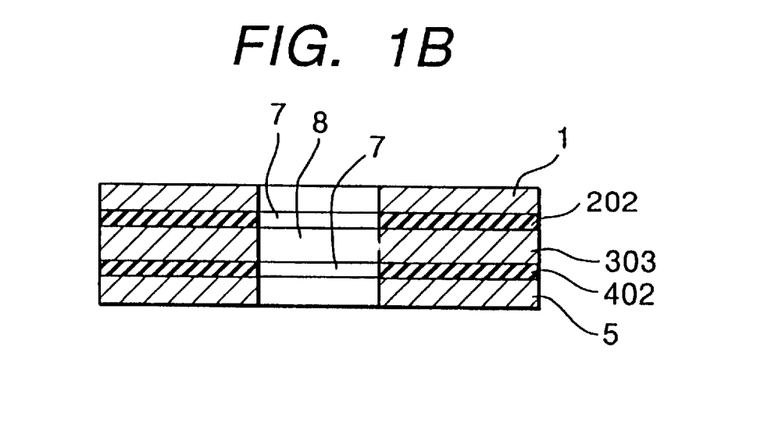
FIG. 1(b) is a cross-sectional view of the phase plate taken along line 1B—1B of FIG. 1(a) as seen in the direction indicated by arrows.
Figure 2:
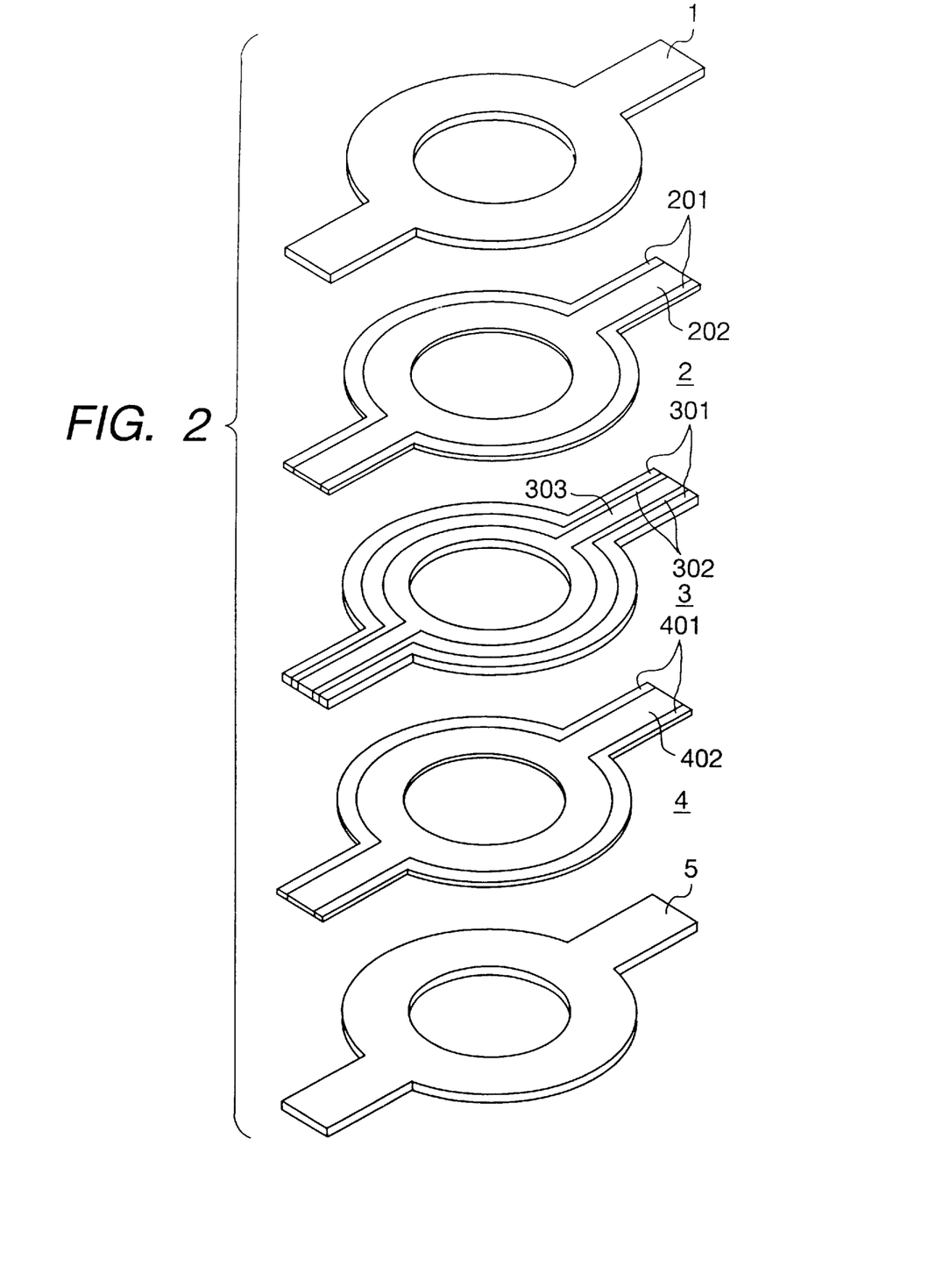
FIG. 2 is a perspective view illustrating respective layers that constitute the phase plate shown in FIG. 1A to more specifically describe the configuration of the phase plate shown in FIG. 1A.

FIG. 1($a$) shows the external appearance of a ring-shaped phase plate according to one embodiment of the present invention. The phase plate according to the present embodiment comprises a ring portion which serves as a phase plate and a support portion for mounting the phase plate that projects from the ring portion. The phase plate 100 according to the present embodiment is substantially shaped in the form of a layered structure composed of layers 1 through 5 as is the case in which a sectional structure thereof is shown in FIG. 1($b$), a more specific structure thereof is illustrated in FIG. 2 and one example of a method of manufacturing the phase plate is shown in FIGS. 6A–6E. As will be described later, the layers 1 through 5 respectively correspond to a conductor layer 1, an insulator layer 202, a conductor layer 303 and an insulator layer 402 as seen in FIG. 1($b$).

Referring to FIG. 2, the outermost layers 1 and 5 provided on both sides are formed as conductor layers over their entirety. Two layers 2 and 4 provided inside the outermost layers 1 and 5 are constructed such that only outer peripheral portions 201 and 401 of ring portions are formed as conductor layers and other portions 202 and 402 are formed as insulator layers. A central layer 3 is constructed such that outer peripheral portions 301 are formed as conductor layers and the innermost peripheral portion 303 is formed as a conductor layer. Regions 302 provided between the outer peripheral portions 301 and the innermost peripheral portion 303 are defined as insulator layers. An inner surface of the conductor layer 303 of the central layer 3 serves as an electrode 8 to be described later and can be electrically connected to the outside through the support portion of the ring. Since the conductor layer 303 is formed as the innermost peripheral portion, it is exposed at the inner surface of the ring portion so as to function as the electrode 8. As will be explained later, the electrode 8 is supplied with a predetermined potential for controlling an electrostatic potential produced inside the ring to a predetermined value. Namely, the present phase plate has a structure wherein as seen in the end on the left side of FIG. 1($a$), a lead portion 101 of the electrode 8 is surrounded by conductor layers 103 with an insulating layer 102 interposed therebetween and as seen in the central portion of Fig. 1($a$), only the electrode 8 is exposed to the inner surface of the ring.

By placing the phase plate 100 having such a structure on the optical axis of the back focal plane of the objective lens, grounding the conductor layers 103 surrounding the electrode 8 and controlling the potential at the electrode 8 to a required potential through the lead portion 101 of the support portion (a mechanism for electrically connecting the conductor layers 103 and the lead portion 101 of the electrode 8 to the outside so as to provide ground and a required potential is omitted from the drawing), the electron beam no longer charges up the insulator by directly contacting the insulator and hence a problem on the charge of the insulator can be resolved. On the other hand, the supply of the necessary potential to the lead portion 101 of the electrode permits the control of the electrostatic potential produced inside the ring to the predetermined value.

Owing to electrostatic shielding effects of the conductor layers 103 provided at both surfaces, the electron beam transmitted through the outside of the ring can substantially completely eliminate the influence of the electrostatic potential by the electrode 8 exposed to the inner surface of the ring. However, the electron beam transmitted inside the ring will cause a phase shift relative to the electron beam transmitted through the outside, which is proportional to a quantity obtained by integrating the electrostatic potential produced by the electrode 8 along the orbit of electrons.

If the electrostatic potential is now assumed to be an axial-symmetrical electrostatic potential, then a phase shift is quantitatively given as follows:

$$\Delta\Phi(\rho)=(\pi e/\lambda E)\int V(\rho z)dz \quad (1)$$

where $\rho$: radius extending from optical axis, z: coordinates on optical axis, $\Delta\Phi(\rho)$: phase shift of electron at incident position $\rho$, e: unit charge of electron, $\lambda$: de Broglie wavelength of electron, $V(\rho,z)$: axial-symmetrical electrostatic potential, and E: energy of incident electron beam. The integration of the electrostatic potential is taken along the orbit of each electron. If it is now considered that the electron beam to be used runs at extremely high speed and the electrostatic potential at the phase plate is low, then the electron beam may be regarded to enter substantially in parallel to the optical axis. For example, when an electron accelerated to several hundreds of kV or so is used and the potential at the electrode 8 is considered to be several volts V or so, this approximation is sufficiently established.

As in the structure of the phase plate 100 according to the present embodiment, the result of integration given by the above equation can take a constant value without depending on the incident position $\rho$ of the electron where the electrostatic potential produced by the electrode 8 supplied with the potential is locally enclosed inside the ring by surrounding the periphery of the symmetry axis with the electrode 8 of the same potential and interposing the electrode 8 between other two electrodes 1 and 5 from both surfaces of the electrode 8. Namely, in this case, a quantity obtained by integrating a three-dimensional electrostatic potential in the direction of incidence of the electrons becomes a finite value and the resultant quantity complies with the two-dimensional Laplace's equation. In order to satisfy boundary conditions based on given geometric conditions, only a constant value is allowed inside the ring of the phase plate 100.

On the other hand, it can be shown in general that the result of integration by the above equation at the outside of a charged ring is logarithmically attenuated with respect to the distance of the ring. However, since the electrostatic potential at the outside of the ring is shielded or screened by the conductors in the present invention, the electron beam that passes through the outside of the ring, is not subjected to the phase shift.

Thus, the electron beam, which passes through the inside of the ring of the phase plate 100, undergoes a predetermined phase shift relatively regardless of its incident position as compared with the electron beam that passes through the outside thereof. From this fact, the potential to be applied to the electrode can be estimated quantitatively as follows. The integral term given in the above equation (1) can be estimated by the product of the potential supplied to the electrode and the thickness of the electrode. When, for example, an electron beam having an accelerating voltage of 200 kV is used and the thickness of the electrode 8 is set to 250 nm, it can be understood that the potential at the electrode 8 may be set to 1V to bring the value of the above equation (1) to $\pi/2$ if inversely operated. It is of importance in the present embodiment that the thickness of the electrostatic potential is kept constant without depending on the position of incidence of each electron as if a thin film of uniform thickness exist inside the ring. Thus, since the direct wave can pass through the vacuum, a conventional problem does not arise that charging occurs due to contamination.

The present embodiment takes note of the fact that the electron beam that passes through the inside of the ring, can provide the predetermined phase shift relatively regardless of its incident position as compared with the electron beam transmitted through the outside by surrounding the periphery of the optical axis for each electron with the ring-shaped electrode supplied with a uniform potential extremely low as compared with the accelerating voltage of each incident electron and interposing the electrode between the two other grounded ring-shaped electrodes so that the electrostatic potential produced by the electrode is localized inside the ring. This note will be of extreme importance to the phase-contrast electron microscope.

In the present embodiment as well, the structure symmetrical as seen in the upward and downward directions is adopted wherein the central electrode is formed as the center and the openings of the conductor layers, which are defined inside the ring, are set equal in diameter to each other. However, the setting of the diameters of the ring-internally defined openings of the conductor layers 1 and 5 to the diameters smaller than that of the electrode 8 can prevent irradiation of insulator layers 7 exposed to the top and bottom of the electrode 8 with the electron beam and is also useful for preventing needless charging of the insulator layers 7 (corresponding to the portions designated at numerals 202 and 402 in FIG. 2) exposed to the ring inner surface.

Now, the following relationship is established between a typical size d of a specimen observable by the phase contrast in the present embodiment, the outside diameter (2r) of the ring in the center of the phase plate and the focal length f of the objective lens.

$$d = f\lambda/r \tag{2}$$

When an electron beam($\lambda$=5.4 pm) of 50 kV is used, the diameter (2r) of the ring is defined as 4 $\mu$m and the focal length of the objective lens is set to 100 mm by way of example, it is possible to observe a structure of d=250 nm or so. Since the phase plate is inserted into the position of the focal length of the objective lens and it is difficult to continuously vary it, the phase plate is set so as to be inserted into positions (e.g., positions of 10 mm and 100 mm) of focal lengths of several typical objective lenses, the focal lengths of the objective lenses are changed according to the size of a specimen to be observed and a phase plate corresponding to the changed focal length is used. It is thus possible to observe specimens different in size. At this time, it is necessary to vary an image-forming lens below the corresponding objective lens in interlock with it.

In the normally-used optical phase-contrast microscope, a thin metal film is used to vary the ratio between a direct wave and a scattered wave as well as to change the phase of the direct wave. This is done to prevent difficulties in observing a specimen weak in scattered wave, which arise due to the fact that when the specimen is used, contrast produced by the interference of the scattered wave and the direct wave hides behind a background resistant to the direct wave itself. In the present embodiment, the ratio between the direct wave and the scattered wave can be varied by changing the inside diameter of the ring. Namely, the more the inside diameter of the ring is decreased, the more the direct wave transmittable through the phase plate is reduced. Accordingly, each specimen can be observed under the change of the ratio between the direct wave and the scattered wave according to the intensity of scattering of the specimen by making switching between four or so many types of phase plates different in ring inside diameter, which are suitably spaced away from each other and arranged in series or on the perimeter of a predetermined diameter, by a movement or transfer mechanism. Thus, the contrast of an image at the time of the observation of the specimen can be improved by optimizing the ratio between the direct wave and the scattered wave.

Figure 3:
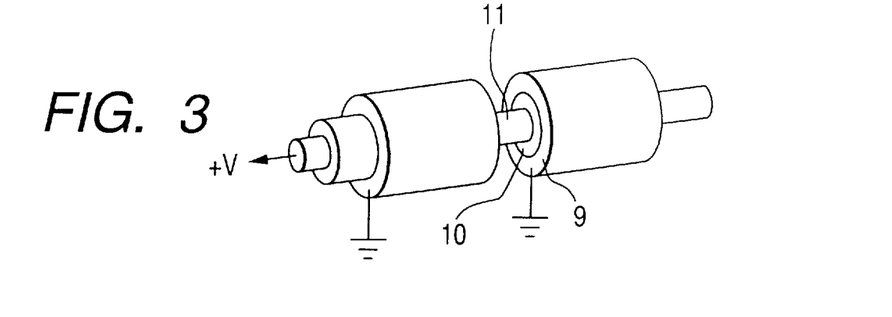
FIG. 3 is a perspective view showing a phase plate according to another embodiment of the present invention.

FIG. 3 shows the external appearance of a thin-wire shaped phase plate corresponding to one of other embodiments. The phase plate according to the present embodiment comprises a central portion from which a conductor 11 serving as the phase plate is exposed, and support portions for covering the conductor 11 with insulator layers 10 and provided with conductor layers 9 on their peripheries. Each support portion is used to mount the phase plate thereon and also serves as a lead portion extending to the exposed conductor 11 of the phase plate in tandem with this. Although the phase plate according to the present embodiment resembles the phase plate (see FIG. 11(c)) using the electrostatic potential, which has been introduced in the previously-cited paper, at first glance, the present phase plate is essentially different from the phase plate in that the electrostatic potential can be externally controlled.

The electrostatic potential created by the exposed conductor 11 is approximately spherically-symmetrical with a potential exposed-portion as the center. If a phase shift that an electron incident to a position $\rho$ at a back focal plane of an objective lens undergoes, is calculated as described in the aforementioned embodiment, then the phase shift can be given by the following equation:

$$\Delta\Phi(\rho) = -(2\pi e V/\lambda E) \cdot \rho_0 \cdot \log(\rho/\rho_0) \tag{3}$$

where $\Delta\Phi(\rho)$: phase shift of electron at incident position $\rho$, $\rho_0$: radius of thin wire, e: unit charge of electron, $\lambda$: de Broglie wavelength of electron, V: electrostatic potential at the center of thin wire, and E: energy of incident electron beam. Since this equation is a logarithm of $\rho$, the phase shift abruptly increases at a point where $\rho$ is small and can be regarded as substantially constant at points other than the point.

The phase plate according to the embodiment shown in FIG. 3 is different from that according to the embodiment shown in FIG. 1A and the potential exerts an influence on both the direct wave and the scattered wave. However, a predetermined phase shift can be approximately provided by controlling the potential at the conductor 11 and adjusting the electrostatic potential created by the conductor 11. Described more specifically, an electron microscope needs to take into consideration even a spherical aberration of an objective lens and a phase shift produced due to a focus displacement (called "defocus displacement or quantity"), thus resulting in the addition of these and the phase shift due to the aforementioned phase plate together. Even in that case, however, the electron microscope can be set to the optimum conditions by using a suitable defocus quantity according to a spherical aberration coefficient of the objective lens. Namely, the phase contrast can be uniformly raised in a wide spatial frequency range.

The same principle as that of the optical phase-contrast electron microscope which observes a phase object (specimen reduced in amplitude contrast) as an image with contrast, can be applied to the electron microscope by utilizing the phase plate described above. This will be next described.

The light and the electron beam serve as waves and can be described by two quantities of the amplitude and the phase. They will be described by reference to vector diagrams. Namely, the amplitude of the wave is represented as the length of a vector and the phase thereof is represented as an angle relative to a reference line of the vector.

Figure 4A:
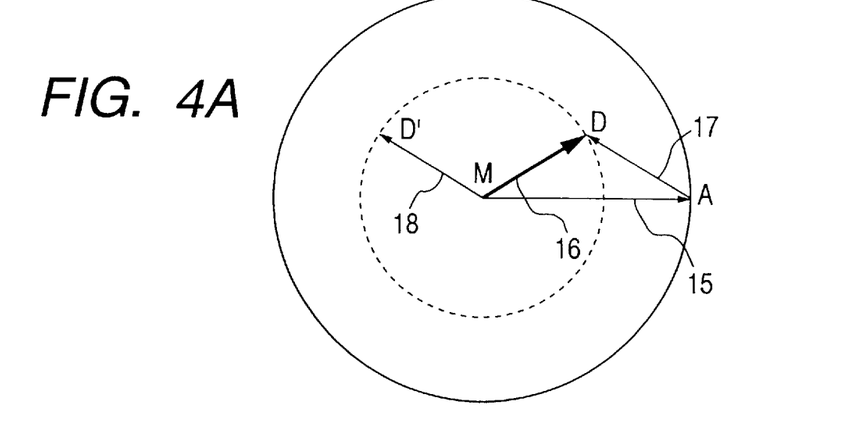
FIGS. 4(a) and 4(b) are respectively views for describing the principle of an optical phase-contrast microscope.
Figure 4B:
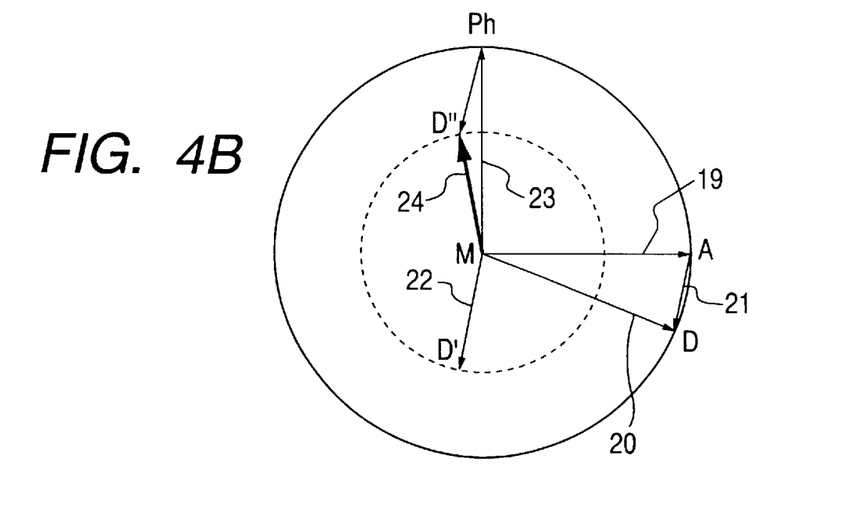

FIG. 4(a) shows a wave 15 (vector MA) incident to a specimen having absorption and a wave 16 (vector MD) transmitted through the specimen. The transmitted wave 16 changes in phase (angle) and amplitude (length) as compared with the incident wave 15. As a result, the transmitted wave 16 can be observed as an intensity difference with respect to the incident wave 15. It can be understood that if attention is now given to the transmitted wave 16 (vector MD), then the transmitted wave 16 is synthesized from the incident wave 15 (vector MA) and a vector AD (=vector MD') designated at numeral 17. This vector MD' shows a wave 18 scattered by the specimen. On the other hand, when a specimen shown in FIG. 4(b) having low absorption is used, a specimen-transmitted wave 20 (vector MD) varies in phase (angle) as compared with an incident wave 19 (vector MA) but remains substantially unchanged in amplitude (length). Accordingly, the transmitted wave 20 (vector MD) cannot be distinguished from the incident wave 19 (vector MA) in terms of the intensity and hence no contrast is applied to the specimen. If attention is now given to the transmitted wave 20 (vector MD), it can be then understood that the transmitted wave 20 is represented in the form of a vector sum of the incident wave 19 (vector MA) and a vector AD (=vector MD') designated at numeral 21 but phase-shifted by—about 90° ($\pi/2$) with respect to the incident wave 19 (vector MA). When the phase of the incident wave 19 (vector MA) is now turned or shifted by+90° ($\pi/2$), the incident wave 19 becomes a wave 23 (vector MPh). However, a wave 24 (vector MD") obtained by synthesizing the wave 23 and a scattered wave 22 (vector MD') is observed as a specimen-transmitted wave. Since this has an intensity difference with respect to the incident wave 23 (vector MPh) observed above, contrast is applied to the specimen. The above description shows the principle of the phase-contrast microscope.

The phase plate according to the present invention with respect to the electron beam also serves so as to vary the phase of the incident wave by $\pi/2$ in a manner precisely identical to the above and allow the scattered wave based on the specimen to pass therethrough as it is. Accordingly, a phase-contrast electron microscope is constructed by placing the phase plate on the back focal plane (position of objective diaphragm) of the objective lens of the conventional electron microscope or in the close vicinity of the back focal plane thereof, whereby the phase object such as a biological specimen can be observed with high contrast.

An embodiment of the phase-contrast electron microscope using the phase plate according to the present invention will next be described with reference to FIG. 5.

Figure 5:
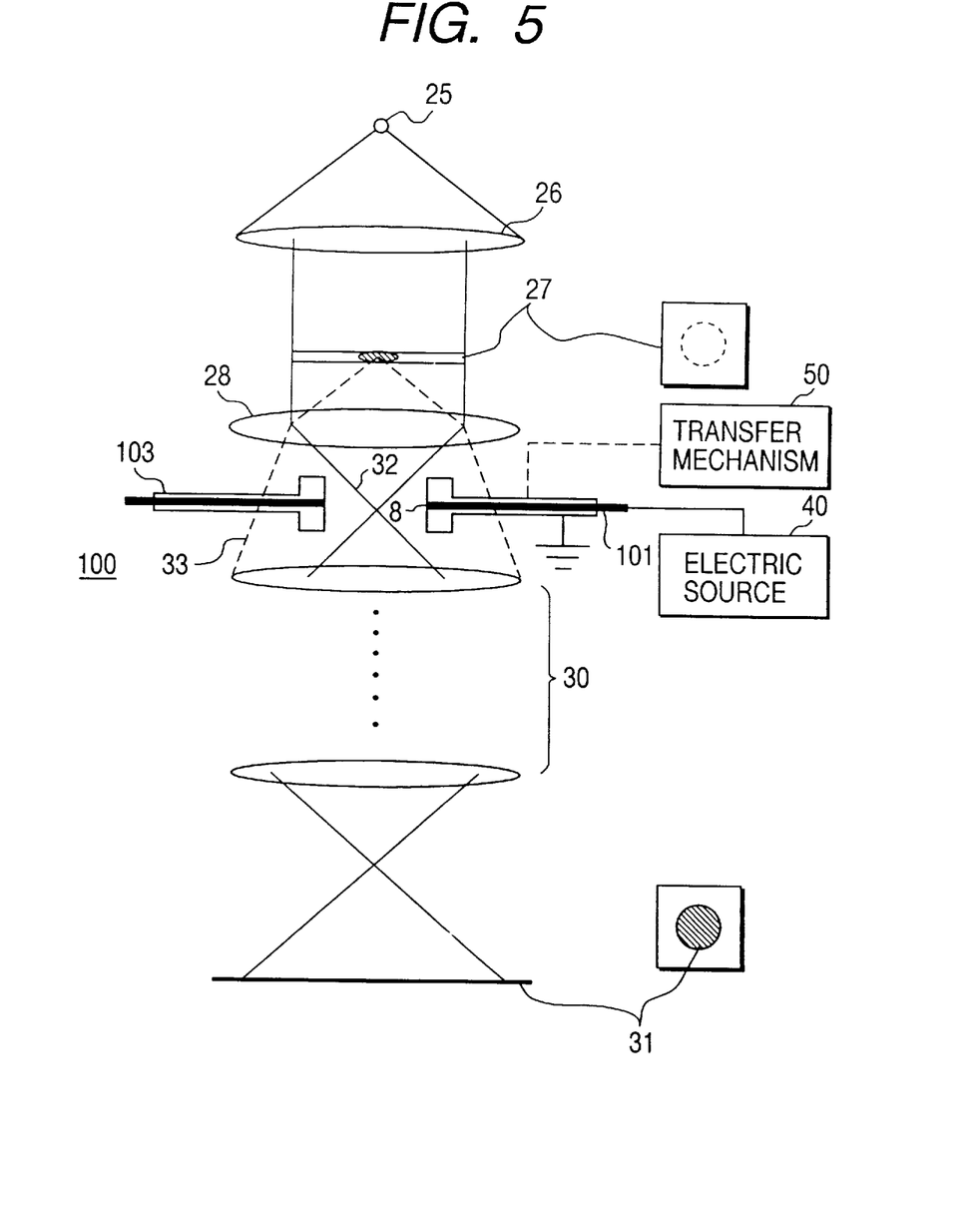
FIG. 5 is a view for describing a basic configuration of an optical system of a phase-contrast electron microscope according to the present invention.

FIG. 5 shows a basic configuration of an optical system of the present embodiment. The present microscope is basically similar in configuration to the normal electron microscope which comprises an electron source 25, a condenser lens 26, a specimen 27, an objective lens 28, an enlargement lens system 30, and an observing plane 31 of each of an image-sensing device and a display unit, for projecting or reflecting a fluorescent screen or an image on the fluorescent screen. A phase plate 100 is placed substantially in the optical axis in the vicinity of a back focal plane of the objective lens 28. Further, a conductor provided outside the phase plate 100 is grounded and a lead 101 extending to a central electrode 8 is supplied with a predetermined potential from an electric source 40. The phase plate 100 is formed as a structure wherein the phase plate 100 can be easily inserted into and withdrawn from the path of each electron by a vacuum transfer mechanism 50. Thus, when the phase plate 100 is placed outside the electron path, the present microscope can be used as the normal electron microscope. When the phase plate 100 is placed substantially in the optical axis of the electron path, the present microscope can be used as the phase-contrast electron microscope as shown in the drawing.

The operation of the phase-contrast electron microscope will next be described. An electron beam emitted from the electron source 25 enters the specimen 27 through the condenser lens 26. After the electron beam has been transmitted through the specimen (phase object) 27, the electron beam 32 having the same amplitude and phase as those of the incident wave passes through the objective lens 28. Thereafter, the electron beam passes through the inside of the phase plate 100 at the back focal plane of the objective lens 28 so that the phase thereof is varied by $\pi/2+n\pi$ (n is determined according to the potential of the central electrode and the thickness thereof but adjusted so as to reach an integer). Increasing n here is equivalent to an increase in the potential supplied to the central electrode of the phase plate. It is thus necessary to keep n small with a view toward neglecting the lens action made by the phase plate. It is however noted that n is not necessarily limited to 0. On the other hand, an electron beam 33 subjected to scattering by the specimen (phase object) 27 and different in phase from the incident electron beam passes through the objective lens 28, followed by being transmitted through the outside of the phase plate 100 at the back focal plane of the objective lens 28. In order to adjust the position of the phase plate 100 so as to be an optical path of such an electron beam 33, an image on the back focal plane of the objective lens 28 located in the phase plate 100 is focused on the observing plane 31 by the enlargement lens system 30 to obtain a diffraction image. Further, the position of the phase plate 100 is automatically or manually adjusted so that the electron beam 32 having the same phase as that of the incident electron beam is transmitted through the inside of the phase plate 100. Thus, it is also necessary to provide a mechanism for adjusting the position of the phase plate 100.

Next, the two electron beams 32 and 33 form an enlarged image of the specimen 27 on the observing plane 31 through the enlargement lens system 30. As described in the paragraph of the principle of the present invention, the resultant image can be observed on the observing plane 31 as an image having an intensity difference, i.e., an image having large contrast. As typically shown on the right sides of the specimen 27 and the observing plane 31 in FIG. 5, the resultant image can be observed as one having sufficient contrast if the contrast of the specimen itself is seen or taken in the form of a phase signal even if it little exists.

A summary of one example of the phase plate according to the embodiment shown in FIG. 1, which is manufactured by the semiconductor manufacturing technology, will next be described with reference to FIGS. 6A–6E. FIGS. 6A–6E are crosssectional views of the phase plate taken along line 6—6 of FIG. 1A as seen in the direction indicated by arrows.

Figure 6A:
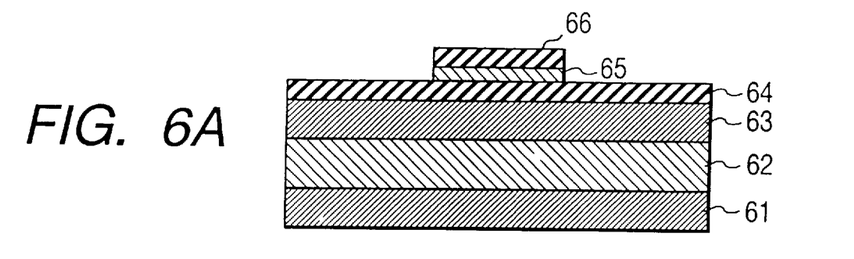
FIGS. 6(A) through 6(E) are respectively schematic views for describing an example of a process for manufacturing the phase plate shown in FIG. 1A.

FIG. 6(A) shows a state in which after anisotropic etching resistant films 61 and 63 have been evaporated onto both surfaces of a silicon substrate 62, a conductive film 64, an insulative film 65 and a conductive film 66 are successively layered on the upper surface of the anisotropic etching resistant film 63, and the insulative film 65 and the conductive film 66 are subjected to patterning. In the present example, the conductive film 64, the insulative film 65 and the conductive film 66 have thicknesses of 250 nm, 100 nm and 250 nm respectively. As will be described later, the anisotropic etching resistant films 61 and 63 are provided for the sake of forming a window and protecting a structure formed on the surface of the silicon substrate 62 from an etchant when anisotropic etching is effected on the silicon substrate 62 from the reverse side thereof. A silicon oxide film (SiO) or a silicon nitride film (SiN) or the like can be used for the anisotropic etching resistant films. For example, the silicon oxide film (SiO) or the silicon nitride film (SiN) or the like can be used as the insulative film 65. However, any types may be used if suitable for purposes of insulation. As the conductive films 64 and 66, gold, platinum, tungsten, aluminum, titanium or titanium nitride or the like can be used. However, any types may be used if suitable for purposes of conductors.

Figure 6B:
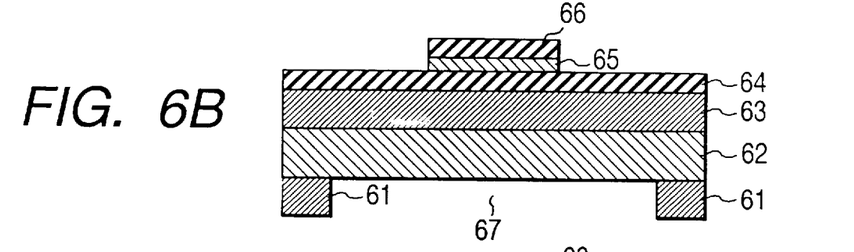

FIG. 6(B) illustrates a state in which an anisotropic etching window 67 is patterned to the anisotropic etching resistant film 61 provided on the back of the silicon substrate 62 by a dry etching method using reactive gas with fluorine as the base.

Figure 6C:
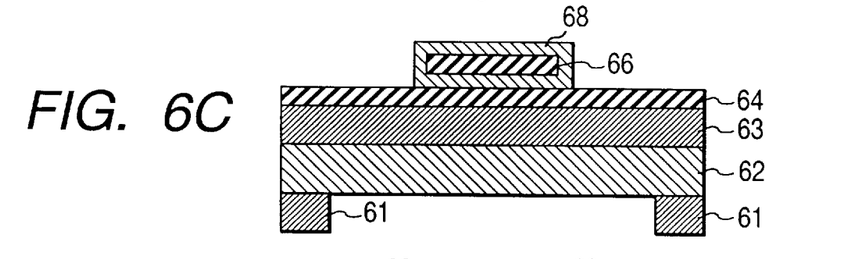

FIG. 6(C) shows a state in which an insulative film 68 of 100 nm is deposited on the periphery of the upper conductive film 66 and is thereafter subjected to lithography by the dry etching method to thereby cover the conductive film 66 with the insulative film 68.

Figure 6D:
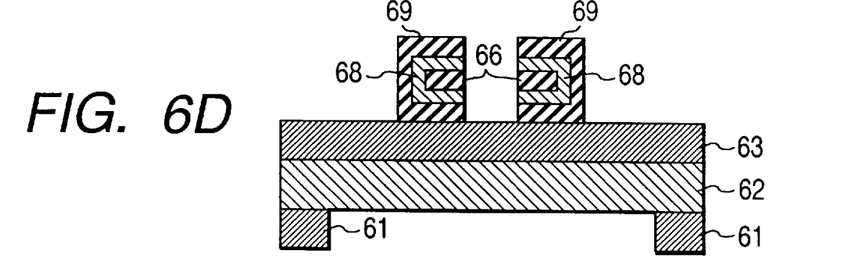

FIG. 6(D) depicts a state in which a conductive film 69 of 250 nm is further deposited on the periphery of the insulative film 68 of the conductive film 66 whose periphery has been surrounded by the insulative film 68, and is thereafter subjected to lithography by the dry etching method to thereby cover the insutlative film 68 with the conductive film 69, after which the ring central portion shown in FIG. 1A is defined by lithography.

Figure 6E:
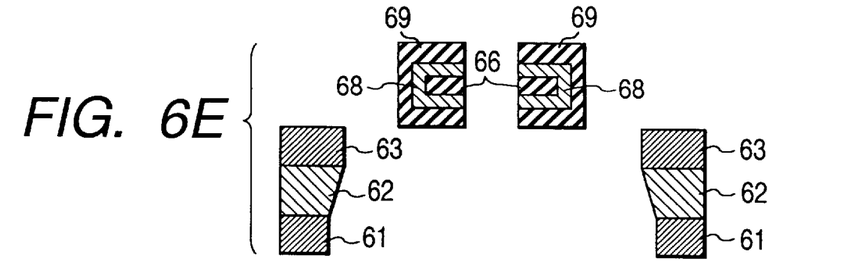

FIG. 6(E) shows a state in which anisotropic etching of silicon is carried out from the reverse side in a state in which the front surface has been protected, to thereby open or define a window of the silicon and thereafter the anisotropic etching resistant film 63 is removed by the dry etching method using the reactive gas with the fluorine as the base.

Although the phase plate shown in FIG. 1A is formed in this way, the formation of the phase plate is not limited to this method. It is needless to say that an arbitrary manufacturing method may be used for its formation. Incidentally, the conductive film 66 shown in FIG. 6(D) corresponds to the conductor layer 303 shown in FIG. 2, the insulative film 68 corresponds to each of the insulator layers 202, 302 and 402, and the conductive film 69 corresponds to each of the conductor layers 1, 201, 301, 401 and 5.

A description will next be made of a case in which according to the phase plate of the present invention, since the potential at the phase plate can be arbitrarily controlled, an aberration correction can be also simply executed.

An electron microscope has a problem that although it has high resolution, the aberration of the electron lens, particularly, the spherical aberration of the objective lens cannot be corrected. This is because the electron lens serves as a convex lens alone in principle unlike an optical lens capable of correcting aberration in accordance with a combination of a convex lens and a concave lens. As a method of overcoming this problem and realizing ultrahigh resolution approaching the wavelength of an electron, Gabor's holography is most famous. Electron holography, which was hard to be realized due to the insufficiency of interference of an electron beam in those days of the invention by Gabor, has been put into practice with the advent of coherent electron source such as a field emission type electron gun in recent years. Further, an experiment for realizing a high resolution of 0.1 nm or better has been reported with an off-axis configuration using an electron biprism (see Phys. Rev. Lett. Vol.74 (1995) p.399, for example). However, such high resolution electron holography has an ever-present problem in that a method of precisely measuring the aberration of the objective lens has not yet been proposed. Since an object can be regarded as a weak-phase object against the electron beam in this type of high resolution electron holography, the corresponding problem becomes equivalent to a problem that parameters corresponding to the aberration are estimated when the distribution of phase of the original object is inversely calculated from an image in conventional high-resolution electron microscopy. It is generally known that an aberration function of an objective lens is represented by two parameters of a spherical aberration coefficient of the objective lens and a defocus quantity under the following equation given using a wavelength $\lambda$ of an electron beam, the spherical aberration coefficient $C_s$, the defocus quantity $\Delta$ and a scattering angle $\beta$.

$$X(\beta) = \frac{2\pi}{\lambda} \left( -\frac{1}{4} \cdot C_s \cdot \beta^4 + \frac{1}{2} \cdot \Delta \cdot \beta^2 \right) \qquad (4)$$

The electron holography cannot reply to a question as to whether the estimated values of these two parameters are truly proper. In conventional high-resolution electron microscopy on the other hand, a series of images is recorded by changing the defocus quantity and their spherical aberration is corrected by image processing of these images. However, the present method cannot similarly reply to a question as to whether the defocus quantity used for the photography is proper. In a two-stage imaging method based on the electron holography, the aberration is light-optically corrected after recording a hologram with the electron beam. Since both the amplitude and phase of an electron wave at an image plane are recorded, the aberration can be corrected anyway. In this case, however, this is performed on the major premise that the aberration function is already known. The aberration given by the equation (4) means so-called coherent aberration established when the interference of the electron or electron beam is complete. In fact, so-called incoherent aberration such as chromatic aberration or the like derived from the incomplete interference of the electron beam must be also considered together.

The following problems on the aberration could not be conventionally resolved simultaneously.

(1) It is difficult to estimate two independent aberration parameters (spherical aberration coefficient and defocus quantity).

(2) The propriety of the estimated parameters is not assured.

According to the phase plate of the present invention, these problems can be simultaneously resolved. It is also possible to obtain an ultra-high resolution image whose aberration has been corrected. Namely, the ultra-high resolution image can be easily realized by placing the phase plate on the optical axis of the back focal plane of the objective lens, recording a series of images providing different relative phase differences between the direct wave and the scattered wave and directly evaluating the aberration function of the lens from them.

The same principle as those of high-precision phase measuring methods employed in an optical interferometry, such as a fringe-scanning method, a heterodyne method, a phase-lock method, etc. can be applied to the observation of the ultra-high resolution image of the weak phase object using the aforementioned phase plate. These methods have been described in the Applied Optics vol.13 (1974), p.2693, the Applied Optics vol.19 (1980), p.154, and the Optical Engineering vol.18 (1979), p.46. These will next be described. In the following description, a one-dimensional description will be used for simple illustration. Since a two-dimensional description causes only an increase in parameter, no generality is lost.

In the fringe-scanning method, heterodyne method and phase-lock method, a phase $\phi(x)$ is precisely measured from the following interference-fringe intensity.

$$I(x) = a(x) + b(x) \cdot \sin(\phi(x) + \Psi(t)) \tag{5}$$

Now, the following equation is introduced as $\psi(t)$ in the fringe-scanning method.

$$\Psi(t) = \frac{n}{M} \cdot 2\pi \tag{6}$$

Further, the following equation is introduced as $\psi(t)$ in the heterodyne method.

$$\Psi(t) = \omega t \tag{7}$$

Moreover, the following equation is introduced as $\psi(t)$ in the phase-lock method.

$$\Psi(t) = \sin \omega t \tag{8}$$

The terms $I(x)$, $a(x)$ and $b(x)$ in the above equation (5) are represented as real variable functions. The respective methods can separate $a(x)$ and $b(x)$ from the measured interference-fringe intensity so as to precisely measure the phase $\phi(x)$.

This will be described using the fringe-scanning method as an illustrative example. In this case, the interference-fringe intensity is given by the following equation:

$$I(x; n) = a(x) + b(x) \cdot \sin\left(\phi(x) + \frac{2\pi n}{M}\right) \tag{9}$$

This equation is rewritten as follows:

$$I(x; n) = a(x) + \frac{1}{2i} b(x) \cdot \exp[i\phi(x)] \cdot \exp\left[\frac{2\pi i n}{M}\right] \\ - \frac{1}{2i} b(x) \cdot \exp[-i\phi(x)] \cdot \exp\left[-\frac{2\pi i n}{M}\right] \tag{10}$$

A first spectrum of this signal series is generally given by the following equation:

$$J(x; l) = \sum_{n=0}^{N-1} I(x; n) \exp\left[-\frac{2\pi i l n}{N}\right] \tag{11}$$

However, if attention is given to a primary frequency spectrum of l=1, then the following equation is obtained as follows:

$$J(x; l=1) = \sum_{n=0}^{N-1} I(x; n) \exp\left[-\frac{2\pi i n}{N}\right] \\ = \frac{N}{2i} \cdot b(x) \cdot \exp[i\phi(x)] \tag{12}$$

Thus, the phase $\phi(x)$ is obtained from this primary frequency spectrum by calculating the following equation:

$$\phi(x) = \tan^{-1}\{Im[J(x; l=1)]/Re[J(x; l=1)]\} + \frac{\pi}{2} \tag{13}$$

The heterodyne method and the phase-lock method can effect specific modulation on the interference fringe in the same manner as the fringe-scanning method so as to precisely measure the phase.

On the other hand, in the image formation of the weak phase object by the electron microscope, a Fourier transform $T(\alpha)$ of an image intensity can be expressed in the following manner by using a Fourier transform $\sigma(\alpha)$ of a phase shift $\phi(x)$ of electron wave caused by an object and an aberration function $\chi(\alpha)$:

$$T(\alpha) = \sigma(\alpha) \cdot \sin \chi(\alpha) \tag{14}$$

where both $T(\alpha)$ and $\sigma(\alpha)$ are generally complex functions. In the above equation (14), $\alpha$ indicates a coordinate in a Fourier space The use of the phase plate can permit the addition of the terms expressed in the equations (6), (7) and (8) to $\chi(\alpha)$ in the equation (14). If the above equation (14) is divided into a real part and an imaginary part, it can be then rewritten as follows:

$$Re(T(\alpha)) = Re(\sigma(\alpha)) \cdot \sin(\chi(\alpha) + \Psi(t)) \tag{15}$$

$$Im(T(\alpha)) = im(\rho(\alpha)) \cdot \sin(\chi(\alpha) + \Psi(t)) \tag{16}$$

As is apparent from the comparison between the equation (5) and the equations (15) and (16), it is understood that an unknown aberration function $\chi(\alpha)$ can be determined by these methods. Although the spherical aberration and the defocus quantity cannot be independently determined in this case, the sum of the two and the entire aberration obtained by adding the contribution of the phase plate itself to the sum thereof may be estimated in the case of the aberration correction.

Figure 7:
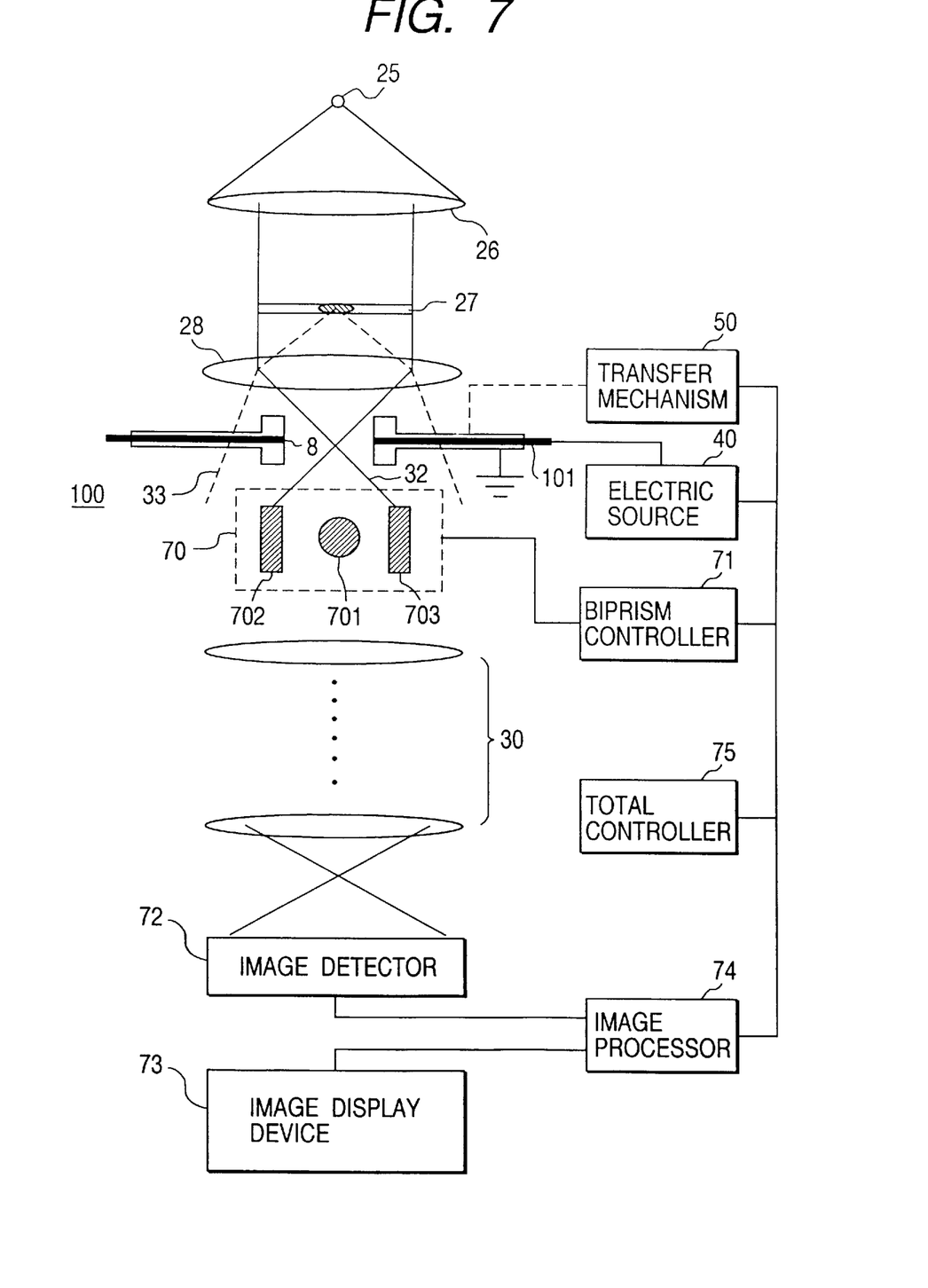
FIG. 7 is a schematic view for describing the structure of an embodiment of an electron microscope to which an aberration-correction is added, on the basis of the embodiment shown in FIG. 5.

A specific example of the aberration correction will next be described with reference to the drawings. FIG. 7 shows the structure of an embodiment of an electron microscope added with the aberration correction on the basis of the embodiment shown in FIG. 5. In the present embodiment, elements of structure identical or equivalent to those shown in FIG. 5 are identified by like reference numerals. As is apparent from the comparison between both drawings, an electron biprism 70 is added to a passage or path of an electron or electron beam. Further, an image detector 72 is placed as an alternative to the observing plane 31. The biprism 70 is controlled by an electron biprism controller 71 capable of controlling the position of the biprism 70 and the voltage to be applied thereto. An output produced from the image detector 72 is processed by an image processor 74 and thereafter an image display device 73 displays an image picture of a specimen based on the output in a manner similar to the normal electron microscope. As will be described later, the electron biprism controller 71 and the image processor 74 are consistently controlled by a total controller 75 together with a transfer mechanism 50 for controlling the shift or movement of a phase plate 100 and the potential at the electrode 8 of the phase plate 100. It is needless to say that each of the biprism controller 71, the image processor 74 and the total controller 75 may be either of one having a so-called microcomputer incorporated therein and one in which the function of one computer is presented in separate form.

The electron biprism 70 has a structure in which it can be easily withdrawn from or introduced into an electron path by the transfer mechanism in a manner similar to the phase plate 100. The electron biprism 70 is composed of a wire 701 used as an electrode and ground electrodes 702 and 703. Further, the electron biprism 70 is placed above an enlargement lens system 30 but is used by being shifted to the path of the electron beam only when it is necessary to calibrate a phase shift corresponding to an electric potential of a phase plate to be described below.

Figure 8:
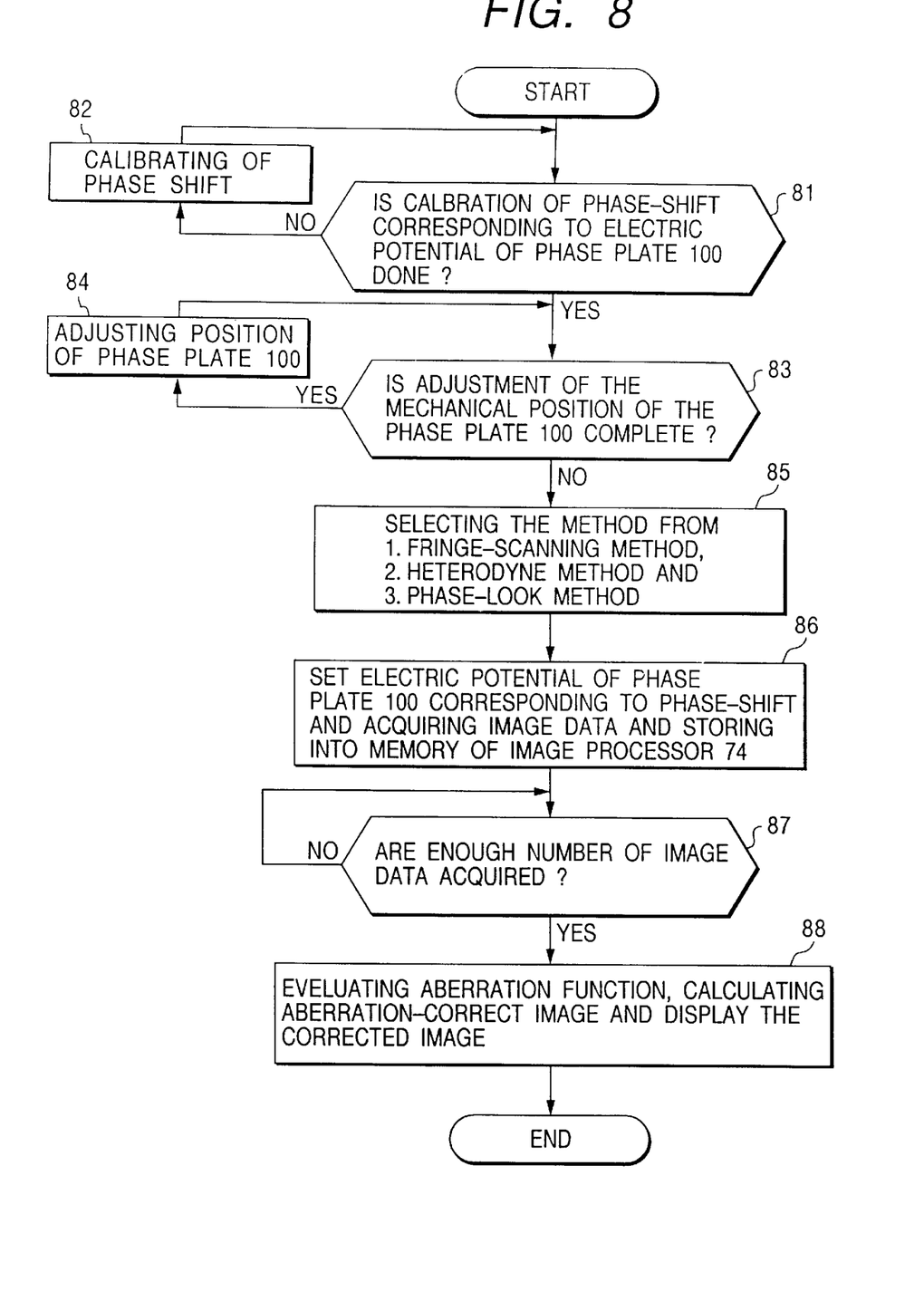
FIG. 8 is a flowchart for describing the whole construction of procedural steps for obtaining aberration-corrected images through the use of the phase plate using an electrostatic potential, which is shown in FIGS. 1A–1B.

A procedure for obtaining an image whose aberration has been corrected, using the phase plate utilizing the electrostatic potential shown in FIG. 1 will now be described with reference to FIGS. 8, 9 and 10. The overall flow of process steps is illustrated in FIG. 8 as a flowchart. The process steps are controlled by the total controller 75.

A phase shift corresponding to an electric potential of the phase plate 100 is first calibrated in Steps 81 and 82. However, when the relationship between the phase shift corresponding to the electric potential of the phase plate 100 and the potential supplied to the phase plate 100 is already known in advance in some way, an operator gives the setting of its contents to the total controller 75. Therefore, the answer in Step 81 is YES, so that the routine procedure does not pass through Step 82 and hence proceeds to the next Step 83.

Figure 9:
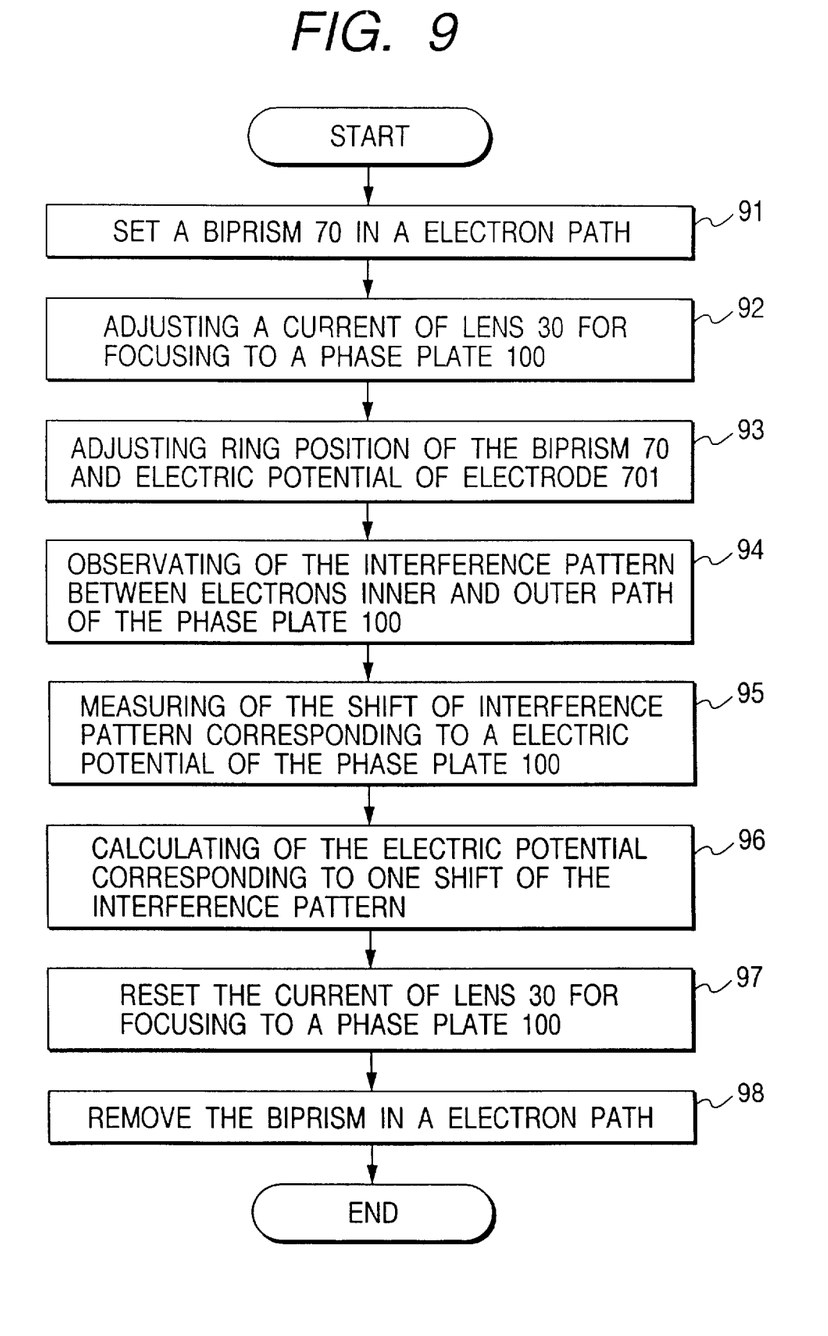
FIG. 9 is a flowchart for describing a step for the calibration of phase shift, of the steps shown in FIG. 8.
Figure 10A:
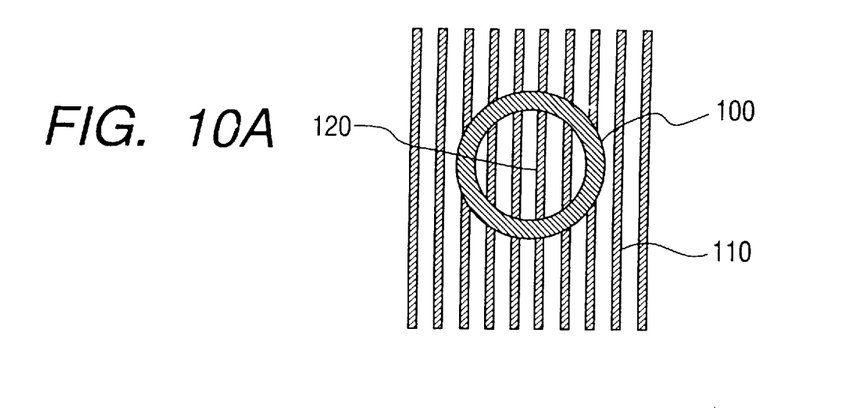
FIGS. 10A, 10B, and 10C are views illustrating examples of image changes which appear in the calibration-of-phase shift step.
Figure 10B:
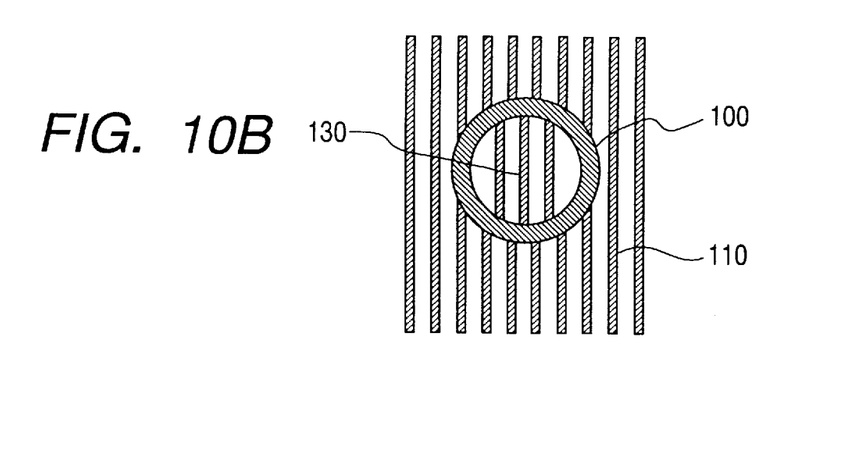
Figure 10C:
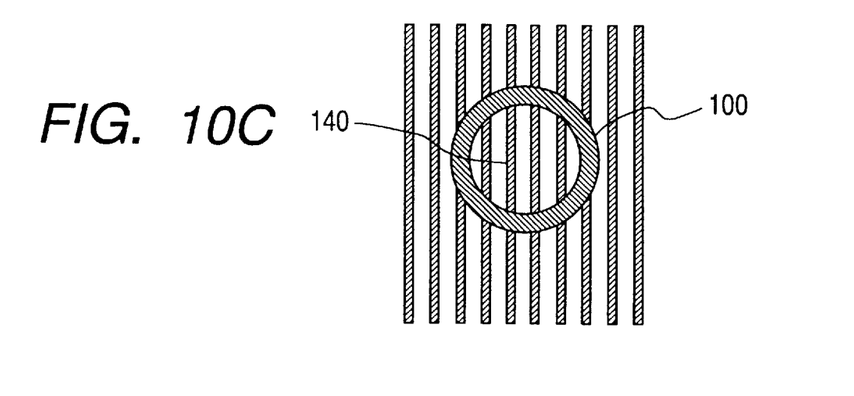

A detailed example of Step 82 for the calibration of the phase shift will be shown in FIG. 9 as a flowchart. Firstly, the electron biprism 70 is set in an electron path (Step 91). A current of a lens 30 is adjusted and the focal point of the electron microscope is focused to the phase plate 100 without being focused to a specimen 27 (Step 92). The position of the electron biprism 70 is adjusted and an electric potential is applied to the electrode 701 of the biprism 70 (Step 93). In this condition, equally-spaced interference patterns between electrons 120 transmitted through the inside of a ring of the phase plate 100 and electrons 110 transmitted through the outside thereof are observed (Step 94). In this stage, a phase shift corresponding to an electric potential of the phase plate 100 still remains nothing and hence the interference pattern are arranged in a straight line inside and outside the ring. This state will be shown in FIG. 10(a). A shadow designated at numeral 100 corresponds to a ring portion of the phase plate 100. When the potential of the phase plate 100 is adjusted by the electric source 40 so that a desired potential is applied to the phase plate 100 to observe each interference pattern in the next Step 95, each interference pattern inside the ring begins to shift. When the phase shift corresponding to the potential of the phase plate 100 is brought to a value equivalent just to half the wavelength of the electron, the interference patterns are shifted just by half intervals inside and outside the ring as designated at numerals 130 in FIG. 10(b). When the potential further increases, the interference patterns are arranged again in a straight line inside and outside the ring as designated at numerals 140 in FIG. 10(c). However, the phase shift corresponding to the electric potential of the phase plate 100 corresponds to one wavelength at this time. An electric potential $V_0$ required to supply a phase shift corresponding to one wavelength of an electron can be precisely measured by further increasing the voltage and measuring several potentials at which the interference patterns are arranged in the straight line (Step 96). In this case, the electric potential may be either positive or negative. The direction of transfer of each interference pattern inside the ring is simply reversed between the positive and negative potentials. The absolute value $V_0$ of the potential required to provide the phase shift equivalent to one wavelength of the electron is made identical. When the calibration of the phase shift corresponding to the electric potential of the phase plate has been completed, the lens current is reset (Step 97). The unnecessary biprism is shifted to the outside from the electron path (Step 98). The calibration of the phase shift is terminated in this way.

It is next determined in Step 83 whether the electron beam, which has converged on the back focal plane of the objective lens 28, passes through just the center of the ring of the phase plate 100. If the electron beam is found not to pass through the center of the ring of the phase plate, it is then determined that it is necessary to perform the alignment of the phase plate 100. Thereafter, its alignment is executed in Step 84. In the present step, a current of a image-formation or focusing lens 30 is adjusted to align the focal point of the electron microscope with the phase plate 100 inserted into the back focal plane of the objective lens. The position of the phase plate is shifted so that the electron beam focused onto the back focal plane of the objective lens 28 passes through just the center of the ring of the phase plate. Upon completion of its alignment, the lens current is adjusted to align the focal point of the electron microscope with the specimen.

When the alignment of the phase plate is completed, one is selected from the methods used for the aforementioned aberration correction (Step 85). The following description will be made on the assumption that the fringe-scanning method has been selected. In the fringe-scanning method, M ($M \geq 2$) images are required in total. The number of M can be selected by an observer but may range from normally about 10 to 100.

The relationship between a phase shift $\Delta\Phi$ of an electron beam and an electric potential V supplied to a phase plate is represented as follows:

$$\Delta\Phi = (\pi e/\lambda E) V \cdot d \qquad (17)$$

where e: quantity of unit charge of electron, $\lambda$: de Broglie wavelength of electron beam, E: energy of electron beam and d: thickness of central electrode of phase plate. Since the potential $V_0$ required to supply the phase shift corresponding to one wavelength of the electron is obtained in Step 82 as in the description of the calibration of the phase shift, the following equation is obtained as follows:

$$2\pi = (\pi e/\lambda E) V_0 \cdot d \qquad (18)$$

From this equation, the following equation is derived as follows:

$$d = (2\lambda E)/(eV_0) \quad (19)$$

Thus, when a potential V is generally applied to the phase plate 100, the phase shift is given by the following equation:

$$\Delta\Phi = 2\pi \cdot (V/V_0) \quad (20)$$

Therefore, an nth potential V(n) given by the fringe-scanning method may be given by the following equations:

$$2n\pi/M = 2\pi \cdot (V(n)/V_0) \quad (21)$$

Eventually, $$\left. \begin{array}{rcl} V(n) & = & (nV_0)/M \\ n & = & 1, 2, \ldots, M \end{array} \right\} \quad (22)$$

Otherwise, if the thickness d of the electrode 8 at the central portion of the phase plate can be precisely controlled during the manufacturing process as described in FIG. 6 and is known, then the potential V(n) may be given by the following equations:

$$2n\pi/M = (\pi e/\lambda E)V(n) \cdot d \quad (23)$$

Eventually, $$\left. \begin{array}{rcl} V(n) & = & (2n\lambda E)/(Med) \\ n & = & 1, 2, \ldots, M \end{array} \right\} \quad (24)$$

In Step 86, images Q (x, y; n) obtained when the potential V(n) given by the equation (22) or (24) is applied to the phase plate 100, are successively detected by the image detector and stored in the image processor 74. Here, x and y indicate two-dimensional coordinates for respective pixels of each image. It is determined in Step 87 whether the required number of images has been obtained. In the next Step 88, two-dimensional Fourier transforms of a series of images are calculated to obtain a series of real parts r ($\xi$, $\eta$; n) and imaginary parts i ($\xi$, $\eta$; n). Thereafter, aberation-corrected image is displayed. Here, $\xi$ and $\eta$ are coordinates in a two-dimensional Fourier space. An aberration function to be determined is obtained from the following equation by reference to the equation (13):

$$\chi(\xi,\eta) = \tan^{-1}\{IM[R(\xi,\eta;l=1)]/Re[R(\xi,\eta;l=1)]\} \quad (25)$$

or, $$\chi(\xi,\eta) = \tan^{-1}\{Im[I(\xi,\eta;l=1)]/Re[I(\xi,\eta;l=1)]\} \quad (26)$$

where R($\xi$,$\eta$;l) and I($\xi$,$\eta$;l) respectively indicate first spectrums of one-dimensional signal series r ($\xi$, $\eta$; n) and i ($\xi$, $\eta$; n). Thus, the unknown aberration function can be precisely determined. When the aberration function is determined in this way, an image or hologram is photographed under conditions in which the aberration is already known, so that an image whose aberration has been corrected, can be calculated from it. Further, the approximation of the determined aberration function to the equation (4) also permits determination of a spherical aberration and a defocus quantity.

The present embodiment has described the phase plate having the ring structure shown in FIG. 1A by using the fringe-scanning method as an example. It is however needless to say that the present processing can be executed even in the case of the phase plate using other method or the phase plate having the structure shown in FIG. 3.

According to the present invention, a phase plate capable of observing a specimen (phase object) low in amplitude contrast, such as a biological specimen as an image with high contrast without heavy-metal staining, and a phase-contrast electron microscope using the phase plate can be realized in a manner similar to an optical phase-contrast microscope owing to the mounting of the phase plate to the normal electron microscope as an additional means, It is also possible to obtain a high-resolution image in which the aberration of an objective lens has been corrected.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

What is claimed is:

1. A phase plate disposed in a substantially optical-axis position in the vicinity of a back focal plane of an objective lens of an electron microscope and shaped in ring form, comprising:

a ring-shaped microelectrode covered with conductors adapted so as to expose a ring inner surface through which electrons corresponding to a focused electron beam of a direct wave formed in said substantially optical-axis position pass and to interpose said microelectrode between said conductors with insulators interposed therebetween; and a conductor for introducing an external potential into said microelectrode.

2. A phase plate as claimed in claim 1, wherein a plurality of rings different in inside diameter from each other are linked together.

3. A phase plate disposed in a substantially optical-axis position in the vicinity of a back focal plane of an objective lens of an electron microscope, comprising:

a thin-wire shaped electrode covered with conductors adapted to expose portions lying in a region through which electrons corresponding to a focused electron beam of a direct wave lying in said substantially optical-axis position and to wrap said electrode therein with insulators interposed therebetween.

4. A phase-contrast electron microscope having a phase plate disposed in the vicinity of a focused electron beam of a direct wave formed on an optical axis adjacent to a back focal plane of an objective lens, said phase plate comprising a microelectrode covered with conductors adapted so as to expose portions through which electrons corresponding to the focused electron beam of the direct wave pass and to interpose said microelectrode between said conductors with insulators interposed therebetween, and a conductor for introducing an external potential into said microelectrode, said phase-contrast electron microscope comprising:

an electric source for supplying the external potential to said microelectrode, and said conductors interposing said electrode therebetween being grounded.

5. A phase-contrast electron microscope having a phase plate disposed in the vicinity of a focused electron beam of a direct wave formed on an optical axis adjacent to a back focal plane of an objective lens, said phase plate comprising a ring-shaped microelectrode covered with conductors adapted so as to expose a ring inner surface through which electrons corresponding to the focused electron beam of the direct wave pass and to interpose said microelectrode between said conductors with insulators interposed therebetween, and a conductor for introducing an external potential into said microelectrode, said phase-contrast electron microscope comprising:

an electric source for supplying the external potential to said microelectrode, and said conductors interposing said microelectrode therebetween being grounded.

6. A phase-contrast electron microscope as claimed in claim 5, wherein said phase plate includes a plurality of linked rings different in inside diameter from each other and a transfer mechanism for selecting one of said rings of said phase plate.

7. A phase-contrast electron microscope having a phase plate disposed in the vicinity of a focused electron beam of a direct wave formed on an optical axis near a back focal plane of an objective lens and a biprism provided behind said phase plate, said phase plate comprising an electrode covered with conductors adapted so as to expose portions in a region through which electrons corresponding to the focused electron beam of the direct wave pass and to wrap said electrode therein with insulators interposed between said conductors, said phase-contrast electron microscope comprising:

an electric source for supplying an external potential to said electrode, said conductors interposing said electrode therebetween being grounded, and said biprism being used to evaluate the effects of said phase plate prior to the observation of a specimen.

8. A phase-contrast electron microscope as claimed in claim 7, wherein a phase plate is used which comprises a ring-shaped microelectrode covered with conductors adapted so as to expose a ring inner surface through which electrons corresponding to a focused electron beam of a direct wave lying in a substantially optical-axis position near the back focal plane and to interpose said microelectrode between said conductors with insulators interposed therebetween, and a conductor for introducing an external potential into said microelectrode.

9. A phase-contrast electron microscope as claimed in claim 8, wherein said phase plate includes a plurality of linked rings different in inside diameter from each other.

10. A phase-contrast electron microscope as claimed in claim 7, wherein a phase plate is used which comprises a thin-wire shaped microelectrode covered with conductors adapted so as to expose a ring inner surface through which electrons corresponding to a focused electron beam of a direct wave lying in a substantially optical-axis position near the back focal plane pass and to interpose said microelectrode between said conductors with insulators interposed therebetween, and a conductor for introducing an external potential into said microelectrode.

11. A phase-contrast electron microscope having a phase plate disposed in the vicinity of a focused electron beam of a direct wave formed on an optical axis near a back focal plane of an objective lens and a biprism provided behind said phase plate, said phase plate comprising an electrode covered with conductors adapted so as to expose portions in a region through which electrons corresponding to the focused electron beam of the direct wave pass and to wrap said electrode therein with insulators interposed between said conductors, said phase-contrast electron microscope comprising:

an electric source for supplying an external potential to said electrode, said conductors interposing said electrode therebetween being grounded, said biprism being used to evaluate the effects of said phase plate prior to the observation of a specimen, said evaluation being carried out based on a change in image at the time that an electric potential for supplying a diffraction image focused onto an observing surface to said biprism is changed.

* * * * *